United States Patent [19]

Hochschild

[11] Patent Number: 4,855,685
[45] Date of Patent: Aug. 8, 1989

[54] PRECISION SWITCHABLE GAIN CIRCUIT

[75] Inventor: James R. Hochschild, Plano, Tex.

[73] Assignee: Texas Instruments Incorporated, Dallas, Tex.

[21] Appl. No.: 102,971

[22] Filed: Sep. 30, 1987

[51] Int. Cl.$^4$ .............................................. H03G 3/30
[52] U.S. Cl. ......................................... 330/282; 330/9
[58] Field of Search ................. 330/9, 278, 279, 282, 330/277, 129

[56] References Cited

U.S. PATENT DOCUMENTS 4,137,466  1/1979  Schemmel et al. ................ 330/282
4,500,845  2/1985  Ehni ..................................... 330/282

Primary Examiner—Gene Wan
Attorney, Agent, or Firm—Thomas R. FitzGerald; Leo N. Heiting; Melvin Sharp

[57] ABSTRACT

A switchable gain circuit includes an operational amplifier (10) which has an input leg comprised of a series resistor (20) and an MOS transistor (22). A plurality of feedback legs are formed, each comprising one or more resistors that are equal in value to the input resistor (20), and connected in series with a switch transistor. The proportion of the series resistance of the transistor in a given feedback leg to the series resistance in the transistor in the input leg is equal to the proportion of the fixed resistance in the feedback leg and input leg. The value of the series resistance of the feedback transistors therefore factors out the series resistance of the input transistor (22) in the gain calculation. This significantly reduces harmonic distortion in the output signal.

23 Claims, 2 Drawing Sheets

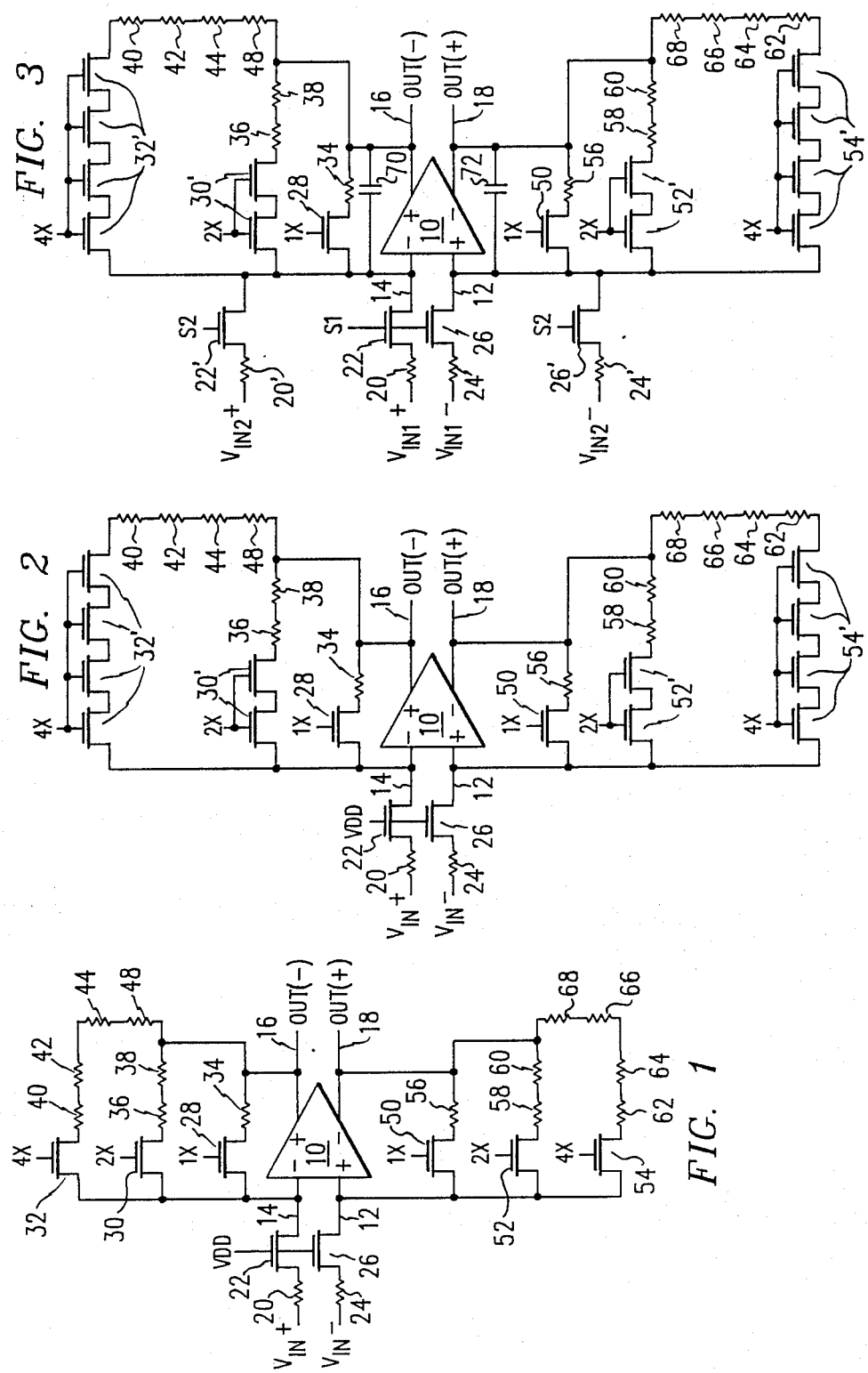

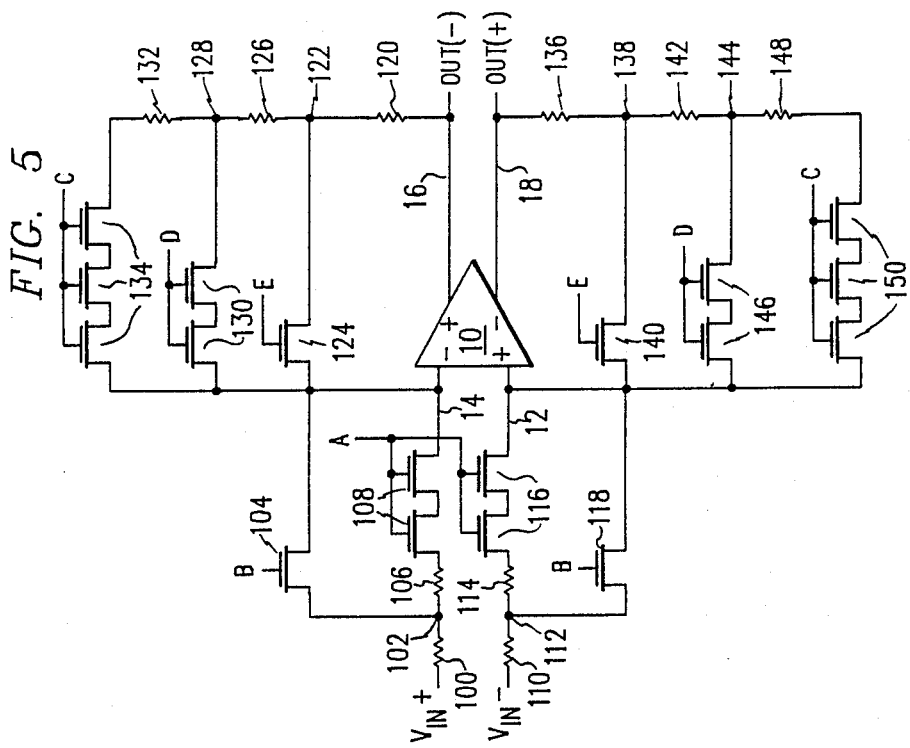
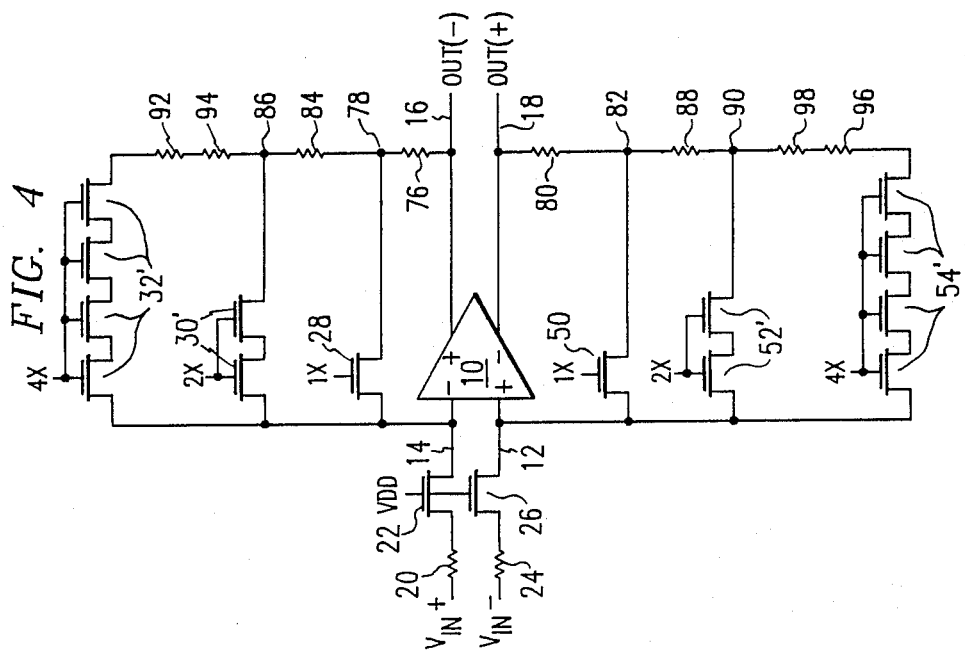

PRECISION SWITCHABLE GAIN CIRCUIT

TECHNICAL FIELD OF THE INVENTION

The present invention disposed and claimed herein comprises a variable gain amplifier and, more particularly, an continuous analog output amplifier having a gain that varies in discrete steps in conjunction with various switches.

BACKGROUND OF THE INVENTION

Analog amplifiers having a variable switched gain have been known in the art for amplifying analog signals at either a continuously variable gain or a discretely variable gain. One type of variable gain amplifier is that utilizing an operational amplifier wherein the gain of the amplifier is determined by the ratio of a feedback resistance leg to a series resistance leg. In these types of amplifier circuits, variable type resistance devices can be utilized or, in programmable type devices, discrete components such as capacitors and resistors are utilized in conjunction with various switches.

One application of a programmable switched gain amplifier is as an analog interface for an analog to digital (A/D) converter. This type of application requires an amplifier that has a continuous analog output with a very low distortion. Typically, the input signal is comprised of an A/C signal ranging from DC to 4 Khz.

Some disadvantages with prior devices utilizing switching of discrete components is recognized in the distortion characteristics. For very small signals such as those incurred in high resolution A/D converters, any distortion can be detrimental. This distortion is normally due to the series resistance of the switching devices that are utilized to switch the components. This series resistance affects the harmonic output of the amplifier due to the series current flowing through both the input and feedback legs of the amplifier. There therefore exists a need for a programmable switched gain amplifier having a continuous analog output and low harmonic distortion.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a schematic diagram of one embodiment of the switchable gain amplifier of the present invention;

FIG. 2 illustrates a schematic diagram of a second embodiment of the switchable gain circuit of the present invention;

FIG. 3 illustrates a schematic diagram of the amplifier of FIG. 2 of the present invention having a multiplexed input;

FIG. 4 illustrates a schematic diagram of an alternate embodiment of the circuit of FIG. 2; and FIG. 5 illustrates a schematic diagram of an alternate embodiment of the circuit of FIG. 2 with a variable input resistance leg.

DETAILED DESCRIPTION OF THE INVENTION

Referring now to FIG. 1, there is illustrated a schematic diagram of one embodiment of the present invention. A differential input/output operational amplifier 10 having a positive input terminal 12, a negative input terminal 14, a positive output terminal 16 and a negative output terminal 18. The amplifier 10 is configured with resistors in the feedback between the input and output terminals and resistors in series with the input to provide the conventional gain relationship of a normal operational amplifier. The gain of the overall circuit of FIG. 1 is proportional to the ratio of the feedback resistors divided by the series input resistors. As will be described hereinbelow, there are multiple combinations of resistors which are selected by MOS switches to provide a programmable gain switching function.

A positive input voltage $V_{IN}+$ is input to one side of a resistor 20, the other side thereof connected to one end of the source-to-drain path of an MOS transistor 22. The other end of the source-to-drain path of transistor 22 is connected to the negative input terminal 14. In a similar manner, a negative voltage input $V_{IN}-$ is connected to one side of a resistor 24, the other side thereof connected to one end of the source-to-drain path of an MOS transistor 26. The other end of the source-to-drain path of MOS transistor 26 is connected to the positive input terminal 12.

The negative input terminal 14 is connected to one end of each of the source-to-drain paths of three MOS transistors 28, 30 and 32, each transistor defining a "feedback leg." The other end of the source-to-drain path of transistor 28 is connected through a series resistor 34 to the positive output terminal 16. The other end of the source-to-drain path of transistor 30 is connected through two series connected resistors 36 and 38 to the positive output 16. The other end of the source-to-drain path of transistor 32 is connected through four series connected resistors 40, 42, 44 and 48 to the positive output terminal 16. The gates of transistors 28, 30 and 32 are connected to control signals 1X, 2X and 4X, respectively, which represent multiplication factors, as will be described hereinbelow.

The negative output terminal 18 is connected through a feedback circuit to the positive input terminal 12 in a similar manner to the relationship between the positive output terminal 16 and the negative input terminal 14. The positive input terminal 12 is connected to one side of the source-to-drain path of each of three MOS transistors 50, 52 and 54. The other side of the source-to-drain path of transistor 50 is connected through a series resistor 56 to the negative output terminal 18. The other end of the source-to-drain path of transistor 52 is connected through two series connected resistors 58 and 60 to the negative output terminal 18. The other end of the source-to-drain path of transistor 54 is connected through four series connected resistors 62, 64, 66 and 68 to the negative output terminal 18. The gates of transistors 50, 52 and 54 are connected to the control signals 1X, 2X and 4X, respectively.

All of the resistors, 20, 24, 34–48 and 56–68 have the same value which is represented as "R". However, the resistors 34–48 and 56–68, which comprise portions of the feedback circuit, can be any multiple of the resistors 20 and 24. The important factor, as will be described in more detail hereinbelow, is that the total resistance for any given feedback leg be a predetermined multiple of the input resistors 20 and 24. In the preferred embodiment, this predetermined multiple is a discrete number, but it should be understood that it can be any multiple.

Each of the MOS transistors 22, 26, 28–32 and 50–54 have a series resistance associated therewith when they are conducting. These devices are typically referred to as transresistance device since, when they are conducting, the gate voltage is connected to the power supply voltage $V_{DD}$. The resistance varies as the square root of the current through the device. Since the amplifier 10, which is a high input impedance operational amplifier, draws no current from the input terminals 14 and 12, the current passes through the resistors in the input leg and through the feedback resistors in the selected one of the feedback legs to the output terminals. As the current varies, so does the series resistance presented by the transistors in the input legs 22 and 26, and the selected transistors 28-32 and 50-54 in the feedback legs. This results in harmonic distortion since the gain will vary as the resistance varies if it is not compensated.

With the circuit of the present invention, the resistance for a given feedback leg is a combination of the series combination of the resistors R and the series resistance of the transistors which is referred to as $R_T$. For example, if the gain of the amplifier were set at "4" by generation of the control signal 4X from an external source, transistors 32 and 54 would have the gates thereof connected to $V_{DD}$ and transistors 28, 30, 50 and 52 would have the gates thereof connected to ground, such that only transistors 32 and 54 conduct. The resistance in the entire feedback leg for each of the positive and negative sides of the amplifier 10 would be equal to $4R+4R_T$ and the resistance on each of the positive and negative input legs would be $R+R_T$. The amplifier gain would be as follows:

$$A = \frac{4R + 4R_T}{R + R_T} = \frac{4(R + R_T)}{R + R_T} = 4$$

It can be seen from the relationship for the gain A that the term $R+R_T$ cancels out leaving the gain independent of the series resistance in the switching device. Therefore, any current variation in the transresistance of the transistors 22, 26, 28-32 and 50-54 would be compensated for and would not be a factor in determining the gain of the overall switchable gain circuit.

Referring now to FIG. 2, there is illustrated an alternate embodiment of the present invention, wherein like numerals refer to like parts in the various figures. The transistor 30 is replaced by a bank of two series connected transistors, transistors 30' and having the gates thereof connected together and to the control signal 2X, each sized identical to transistors 28 and 50. In a similar manner, the transistor 32 is replaced by a bank of four series connected transistors 32" and having the gates thereof connected together and to the control signal 4X, each sized identical to transistors 28 and 50 and connected in series with the resistors 40–48. Similarly, transistor 52 in the circuit of FIG. 1 is replaced by a bank of two series connected transistors 52' with the gates thereof connected together and to the control signal 2X, and connected in series with resistors 58 and 60. Transistor 54 of the circuit of FIG. 1 is replaced by a bank of four series connected transistors 54' connected in series with resistors 62-68 with the gates thereof commonly tied together and to the control signal 4X. Transistors in bank 54' are sized identical to transistors 28 and 50.

The circuit of FIG. 2 operates identical to the circuit of FIG. 1 in that the resistance in each leg is comprised of the series combination of the individual transistors in the particular banks which each have a resistance equal to $R_T$, $R_T$ being a transresistance that is a function of the square root of the current therethrough. With the circuit of FIG. 2, identical devices can be fabricated which eliminates the need for fabricating different size transistors on a particular circuit.

Referring now to FIG. 3, there is illustrated an alternate embodiment of the switchable gain circuit of the present invention which has a multiplexed input, wherein like numerals refer to like parts in the various figures. The circuit of FIG. 3 is identical to the circuit of FIG. 2 with respect to the feedback resistive elements. The input end of resistors 20 and 24 are connected to the voltages $V_{IN1}+$ and $V_{IN1}-$, respectively. The resistors 20 and 24 and the associated transistors 22 and 26, respectively, comprise one of two input legs with the gates of transistors 22 and 26 connected to a control signal S1. A second input leg is provided by a first series connected resistor 20' and transistor 22' which the input of resistor 20' connected to an input voltage $V_{IN2}+$ and the other end of the source-to-drain path of transistor 22' connected to the positive input terminal 14. The other side of the second input leg is comprised of a series connected resistor 24' and transistor 26'. The input of the resistor 24' is connected to an input voltage $V_{IN2}-$ with the other end of the source-to-drain path of transistor 26' connected to the positive input terminal 12. The gates of transistors 22' are connected to the control signal S2.

In operation, either transistors 22 and 26 are selected by raising the control signal S1 to $V_{DD}$ or the transistors 22' and 26' are selected by raising the control signal S2 to the voltage $V_{DD}$. This allows for a multiplexing operation on the input of the operational amplifier 10. Transistors 22' and 26' have an identical resistance to the transistors 22 and 26, such that the amplification operation is identical to that described above with reference to FIG. 2.

In addition to the multiplexing operation, a low pass filter is formed by connecting a capacitor 70 between the input negative terminal 14 and the positive output terminal 16 and a capacitor 72 between the positive input terminal 12 and the negative output terminal 18. This provides a method for filtering high frequency components on the input to the amplifier such that they do not affect the operation of the amplifier.

Referring now to FIG. 4, there is illustrated a schematic diagram of an alternate embodiment of the circuit of FIG. 2, wherein like numerals refer to like parts in the various figures. In accordance with the circuit of FIG. 2, there are three feedback legs for each side of the differential amplifier 10. The feedback legs are comprised of one leg with a single gating transistor 28 for one side and a single gating transistor 50 on the other side, one leg with two series connected gating transistors 30' on one side and 52' on the other side and one leg with four series connected gating transistors 32' on one side and 54' on the other side. The circuit of FIG. 4 differs from that of FIG. 2 in that the resistive portions of the feedback legs are formed by shared resistors. The fixed resistive portion of the feedback leg comprised of the gated transistor 28 is formed with a single resistor 76 connected between a node 78 and the negative output line 16. Node 78 is connected to the source-to-drain path of transistor 28. In a similar manner, the fixed resistive portion of the first feedback leg on the other side of the differential amplifier is formed of a resistor 80 disposed between the output terminal 18 and a node 82, the node 82 connected to one side of the source-to-drain path of transistor 50.

The second feedback leg of the differential amplifier has the fixed resistive portion formed by a resistor 84 disposed between a node 86 and the node 78 with the resistor 76 forming the remaining portion of the total fixed resistance such that resistors 84 and 76 are in series. The node 86 is connected to the source-to-drain path of the two series connected transistors 30'. In a similar manner, the fixed resistance portion of the second feedback leg on the other side of the differential amplifier is formed by a resistor 88, disposed between a node 90 and the node 82, and the resistor 80 such that resistors 80 and 88 are connected in series between the source-to-drain path of the transistors 52' and the output terminal 18.

The fixed resistive portion of the fourth feedback leg is comprised of two series connected resistors 92 and 94 connected between the source-to-drain path of the four series connected transistors 32' and the node 86 in addition to the resistors 76 and 84, such that resistors 76, 84, 92 and 94 are all connected in series with the source-to-drain path of the four series connected transistors 32'. In a similar manner, two series connected resistors 96 and 98 are connected between the source-to-drain path of the four series connected transistors 54' and the node 90 such that resistors 80, 88, 98 and 96 are in series when transistor 54 conducts.

In operation, the 1X signal will cause transistors 28 and 50 to conduct, thus placing resistors 76 and 80, respectively, in the feedback path. In a similar manner, the presence of the control signal 2X will place resistors 84 and 76 and 80 and 88, respectively, in the feedback path. Selection of the 4X control signal will place the resistors 76, 84, 92 and 94, and series connected resistors 80, 88, 96 and 98, respectively, in the feedback paths of the amplifier 10. As noted above, the value of the resistors in both the input legs and the feedback legs is equal to R.

Referring now to FIG. 5, there is illustrated a schematic diagram on an alternate embodiment of the circuit of FIG. 2, wherein like numerals refer to like parts in the various figures. In the embodiment of FIG. 5, each of the input legs that is connected to the input terminals 12 and 14 is each comprised of two switchable legs. The first switchable leg associated with the input terminal 14 includes a series connected resistor 100 which is disposed between the $V_{IN}+$ terminal and a node 102. A gating transistor 104 has the source-to-drain path thereof connected between the node 102 and the input terminal 14. The gate of transistor 104 is connected to a control signal "B". The second portion of the switchable leg associated with input terminal 14 includes the resistors 100, a series connected resistor 106 having one end thereof connected to the node 102 and two series connected transistors 108 having the source-to-drain paths thereof connected in series and disposed between the other end of resistor 106 and the input terminal 14. The gate of transistor 108 is connected to a control signal "A". It can be seen that selection of switching transistor 104 with control signal B results in resistor 100 being disposed in series with input terminal 14 whereas nonselection of transistor 104 and selection of transistor 108 by control signal A results in both resistors 100 and 106 being connected in series with input terminal 14.

The input circuit associated with input terminal 12 is similar to that associated with input terminal 14. The first switchable leg includes a series connected resistor 110 disposed between the input terminal $V_{IN}-$ and a node 112 with a transistor 118 having the source-to-drain path connected between node 112 and the input terminal 12 with the gate thereof connected to the control signal B. The second switchable leg includes both the resistor 110 and a resistor 114 having one end thereof connected to node 112 with two series connected transistors 116 having the source-to-drain paths thereof connected in series and disposed between the other end of resistor 114 and the input terminal 12 with the gates thereof connected to the control signal A.

The feedback circuit between the input terminal 14 and the output terminal 16 is comprised of three feedback legs. The first feedback leg includes a resistor 120 disposed between the output terminal 116 and a node 122. A single transistor 124 has the source-to-drain path thereof connected between the input terminal 14 and the node 122 and the gate thereof connected to control signal E. Selection of transistor 124 results in transistor 120 being disposed in series with the transresistance of transistor 124.

The second feedback leg includes the resistor 120 and a resistor 126 connected in series between node 122 and a node 128. Two series connected transistors 130 having the source-to-drain paths thereof connected in series, are connected between the input terminal 14 and the node 128 with the gates thereof connected to a control signal "D". The selection of transistor 130 results in resistors 120 and 126 being disposed in series with the transresistance of both transistors 130.

The third feedback leg includes the resistor 120, the resistor 126 and a resistor 132 having one end thereof connected to node 128. The other end of resistor 132 is connected to one end of the source-to-drain path of three series connected transistors 133 with the other end thereof of the source-to-drain path connected to the input terminal 14. The gate of transistor 133 is connected to a control signal "C".

The feedback network between the input terminal 12 and the output terminal 18 is similar to the circuit associated with the input terminal 14 and output terminal 16 in that there are three selectable feedback legs. The first leg includes a resistor 136 which is connected between the output terminal 16 and a node 138. A transistor 140 has the source-to-drain path thereof connected between the node 138 and the input terminal 12 with the gate thereof connected to the control signal E. The second feedback leg includes the resistor 136, a resistor 142 connected between the node 138 and a node 144 and two series connected transistors 146 having the source-to-drain paths thereof connected in series and between node 144 and the input terminal 12. The gates of transistors 146 are connected to the control signal D.

The third feedback leg includes the resistor 136, the resistor 142 and a resistor 148 having one end thereof connected to node 144. The other end of resistor 148 is connected to one end of the source-to-drain path of three series connected transistors 150, and the other end of the source-to-drain path thereof connected to the input terminal 12. The gates of transistors 150 are connected to the control signal C.

In the preferred embodiment, all of the resistors in the input legs and the output legs have the same value "R" with the series resistance of the transistor when conducting being equal to "$R_T$". For each input leg, there are "N" resistors and "N" transistors and, for each feedback leg, there are "M" resistors and "M" transistors. Therefore, the series resistance of a given input leg will be equal to $NR+NR_T$ and the series resistance for each output let will be $MR+MR_T$ with the gain being equal to:

$$A = \frac{MR + MR_T}{NR + NR_T} = \frac{M(R + R_T)}{N(R + R_T)} = \frac{M}{N}$$

The circuit of FIG. 5 can provide different gains, depending upon which control signals are selected with N having a value of 1 or 2 and M having a value of 1, 2 or 3. The combination of signals will give the gains illustrated in Table 1.

TABLE 1

| CONTROL SIGNALS | GAIN |
| --- | --- |
| A + C | 3/2 = 1.5 |
| A + D | 2/2 = 1.0 |
| A + E | ½ = 0.5 |
| B + C | 3/1 = 3.0 |
| B + D | 2/1 = 2.0 |
| B + E | 1/1 = 1.0 |

It can be seen that the gain is a function is a value of N and the value of M and that the series resistance of the switching transistors in both selected feedback leg and a selected input leg cancel out.

In summary, there has been provided an operational amplifier with a plurality of different feedback networks that are selectable by series switches. Each of the feedback circuits is comprised of a fixed resistance value which is a multiple of the resistance on the input leg. The feedback circuits are selected by connecting one side thereof to the output and the other side thereof to the associated input terminal through an MOS switch. In a similar manner, an MOS switch is connected between the input resistor and the associated input terminal, the input MOS transistor permanently conducting. The transistor in the feedback path has a series resistance that is proportional with respect to the input transistors by the same ratio as the ratio of the associated feedback resistors to the input resistance. This allows the series resistance of the transistors to be factored out in the gain calculation.

Although the preferred embodiment has been described in detail it should be understood that various changes, substitutions and alterations can be made therein without departing from the spirit and scope of the invention as defined by the appended claims.

What is claimed is:

1. A switchable gain amplifier comprising:
   amplifier circuitry for providing amplification of an analog input signal and having an input terminal and an output terminal, the gain of said amplifier determined by the ratio of a feedback resistance circuit disposed between said input and said output terminals and a series input resistance circuit disposed between said input terminal and the analog input signal;
   said series input resistance circuit comprised of a fixed resistor of a first fixed value connected in series with a variable resistor, said variable resistor having a current variable resistance of a first variable value that varies as a function of current; and
   said feedback resistance circuit comprising a plurality of feedback legs, each feedback leg separably selectable and having:
   a feedback series resistance circuit having a fixed resistance value that is a predetermined multiple of said first fixed value associated with said fixed resistor, and having two ends with one end thereof connected to said output terminal, and
   a switch connected between the other end of said resistor and the input of said amplifier circuitry for selection of said associated feedback leg by an external control signal, said switch having a series resistance that is proportional to the variable resistance of said current variable resistance, the proportion being equal to the predetermined multiple of said associated feedback series resistance circuit.

2. The switchable gain amplifier of claim 1 and further comprising a capacitor having one plate thereof connected to the output terminal and the other plate thereof connected to the input terminal to provide a low pass filter function.

3. The switchable gain amplifier of claim 1 wherein each of said switches in each of said feedback legs comprises:
   an MOS pass gate having a current variable resistance when said MOS transistor is activated by the external control signal; and
   said variable resistor comprises an MOS pass gate disposed in series with said fixed resistor and said input terminal, and configured to be permanently conductive;
   the transresistance of each of said MOS transistors in said feedback legs proportioned with respect to the resistance of said input MOS transistor in accordance with the predetermined multiple of said associated feedback leg.

4. The switchable gain amplifier of claim 1 wherein said predetermined multiple is a discrete number.

5. The switchable gain amplifier of claim 4 wherein:
   said variable resistor in said series input resistance circuit comprises an MOS transistor having a source-to-drain path connected in series with said fixed resistor and said input terminal with a gate connected to a voltage such that said input MOS transistor is permanently conducting; and
   said switch circuitry in each of said feedback legs comprises a predetermined number of series connected feedback MOS transistors connected between said input terminal and the other end of said series resistance circuit, said predetermined number of MOS transistors equal in number to said predetermined multiple.

6. The switchable gain amplifier of claim 4 wherein said series resistance circuit comprises a predetermined number of resistors, each equal in resistance value to said first value of said fixed resistor, said predetermined number equal in value to said predetermined multiple.

7. The switchable amplifier of claim 1 and further comprising:
   a plurality of identical series input resistance circuits having one end thereof connected to one of a plurality of analog input signals; and
   a plurality of gating circuits each associated with one of said series input resistance circuits and operable to selectively connect the other end of the associated one of said series input resistance circuits to said input terminal such than a multiplexing operation is realized.

8. A switchable gain amplifier circuit, comprising:
   an operational amplifier having an input and an output;
   a series input resistance circuit connected between the input of said operational amplifier and an analog input signal; and a feedback resistance circuit connected between the input of said operational amplifier and the output thereof;

the gain of said operational amplifier determined by the ratio of the resistance of said feedback circuit to the resistance of said series input resistance circuit;

said series input resistance circuit comprised of:
a fixed resistance having a first fixed value, and
an input current variable resistance in series with said fixed resistance and having a first variable value that varies as a function of current therethrough;

said feedback circuit comprised of a plurality of feedback legs disposed in parallel with each other between the input and output of said amplifier, each of said feedback legs having:
a fixed resistance having a second fixed value that is a predetermined multiple of said first fixed value, and
switch circuitry for selectively connecting said associated feedback leg between the input and output of said operational amplifier and having a variable resistance value that varies with respect to said first variable value by said predetermined multiple, said switch circuitry selecting said associated feedback leg in response to generation of an external control signal,
said predetermined multiple being a unique number for the associated one of said feedback legs;

wherein the resistance of the one of said feedback legs selectively connected between the input and output of said amplifier by said associated switch circuitry and the resistance of said series input resistance circuit determines the gain of said operational amplifier.

9. The switchable gain amplifier of claim 8 wherein said predetermined multiple for each of said feedback leg is a discrete multiple of said first fixed value.

10. The switchable gain amplifier of claim 9 wherein said fixed resistance in each of said feedback legs comprises a predetermined number of fixed resisters each having a value equal to said first fixed value, said predetermined number equal to said predetermined multiple.

11. The switchable gain amplifier of claim 8 wherein:
said input current variable resistance comprises a transresistance circuit having a series resistance that varies as a function of the current therethrough; and
said switch circuitry for each of said feedback legs comprises a tranconductance device that has an active and conducting state and an inactive and nonconducting state, the state controlled by said external control signal wherein the series resistance in said active state is equal to said first fixed value multiplied by said predetermined multiple.

12. The switchable gain amplifier of claim 11 wherein:
said transresistance circuit comprises a first MOS transistor having a source-to-drain path connected in series with said fixed resistor in said series input resistance circuit and having a gate electrode connected to a control signal that maintains said first MOS transistor in a permanently conducting state; and
said transconductance device comprises a series connected feedback MOS transistor having a source-to-drain path connected in series with the associated one of said feedback legs and a gate electrode for being connected to said external control signal, said feedback MOS transistor sized in accordance with the associated predetermined multiple relative to said input MOS transistor.

13. The switchable gain amplifier of claim 8 and further comprising a capacitor disposed between the input and the output of said operational amplifier to provide a low pass filter function.

14. The switchable gain amplifier circuit of claim 8 and further comprising:
a plurality of said series input resistance circuits each being identical and having one end thereof connected to one of a plurality of analog input signals; and
a plurality of gating circuits each associated with one of said series input resistance circuit and operable to selectively connect the other end of said series input circuit to said input of said operational amplifier in response to an external signal such that a multiplexing operation is realized.

15. A differential switchable gain amplifier circuit, comprising:
a differential operational amplifier having a differential input with positive and negative terminals and a differential output with positive and negative terminals;
each of said positive and negative terminals on said differential input having a series input resistance circuit connected between the associated terminal of said operational amplifier and a corresponding polarity of a differential input signal;
each of said feedback legs having a corresponding feedback leg with an equal resistance in the other of said first or second feedback circuits such that said external signal selects corresponding ones of said feedback legs for connection in feedback;
a first feedback resistance circuit connected between the positive terminal of said differential input and the negative terminal of said differential output;
the gain of said operational amplifier determined by the ratio of the resistance of said first and second feedback circuits to the resistance of said associated series input resistance circuits;
the gain of said operational amplifier determined by the ratio of the resistance of said second and first feedback circuits to the resistance of said associated series input resistance circuits;
each of said series input resistance circuits comprised of:
a fixed resistance having a first fixed value, and an input current variable resistance in series with said fixed resistance and having a first variable value that varies as a function of current therethrough;
each of said first and second feedback circuits comprised of a plurality of feedback legs disposed in parallel with each other between the associated positive and negative terminals of said differential input and output, each of said feedback legs having:
a fixed resistance having a second fixed value that is a predetermined multiple of said first fixed value,
switch circuitry for selectively connecting said associated feedback leg between the associated positive and negative terminals of differential input and outputs of said differential operational amplifier and having a variable resistance value that varies with respect to said first variable value by said predetermined multiple, said switch circuitry selecting said associated feedback leg in response to generation of an external control signal, said predetermined multiple being a unique number for the associated one of said feedback legs.

wherein the resistance of the ones of said feedback legs selectively connected between the differential input and output of said differential operational amplifier by said associated switch circuitry and the resistance of said series input resistance circuit determines the gain of said differential operational amplifier.

16. The switchable gain amplifier of claim 15 wherein said predetermined multiple for each of said feedback legs is a discrete multiple of said first fixed value.

17. The switchable gain amplifier of claim 16 wherein said fixed resistance in each of said feedback legs comprises a predetermined number of fixed resisters each having a value equal to said first fixed value, said predetermined number equal to said predetermined multiple.

18. The switchable gain amplifier of claim 15 wherein:
said input current variable resistance comprises a transresistance circuit having a series resistance that varies as a function of the current therethrough; and
said switch circuitry for each of said feedback legs comprises a tranconductance device that has an active and conducting state and an inactive and nonconducting state, the state controlled by said external control signal wherein the series resistance in said active state is equal to said first fixed value multiplied by said predetermined multiple.

19. The switchable gain amplifier of claim 18 wherein:
said transresistance circuit comprises a first MOS transistor having a source-to-drain path connected in series with said fixed resistor in said series input resistance circuit and having a gate electrode connected to a control signal that maintains said first MOS transistor in a permanently conducting state; and
said transconductance device comprises a series connected feedback MOS transistor having a source-to-drain path connected in series with the associated one of said feedback legs and a gate electrode for being connected to said external control signal, said feedback MOS transistor sized in accordance with the associated predetermined multiple relative to said input MOS transistor.

20. The switchable gain amplifier of claim 15 and further comprising a first capacitor disposed between the positive input terminal and the negative output terminal of said differential operational amplifier and a second capacitor disposed between the negative input terminal and the positive output terminal of said differential operational amplifier to provide a low pass filter function.

21. A switchable gain amplifier comprising:
amplifier circuitry for providing for amplification of an analog input signal and having an input terminal and an output terminal, the gain of said amplifier circuitry determined by the ratio of a feedback resistance circuit disposed between said input and output terminals, and a series input resistant circuit disposed between said input terminal and the analog input signal;

said series input resistance circuit comprising a plurality of series legs, each series leg separately selectable and having:
a series resistance circuit having a resistance value that is equal to a first predetermined multiple of a first fixed value, said series resistance circuit having two ends with one end thereof connected to said input analog signal, and
a switch connected between the other end of said series resistance circuit and the input of said amplifier circuitry for selection of said associated series leg by an external control signal, said switch having a series resistance that is proportional to a first variable resistance value that varies as a function of series current therethrough, the proportion being equal to said first predetermined multiple; and said feedback resistance circuitry comprising a plurality of feedback legs, each feedback leg separably selectable and having:
a series resistance circuit having a fixed resistance value that is a second predetermined multiple of said first fixed value, and having two ends with one end thereof connected to said output terminal, and
a switch connected between the other end of said associated series resistance circuit and the input of said amplifier circuitry for selection of said associated feedback leg by an external control signal, said switch having a series resistance that is proportional to the variable resistance of said first variable resistance value, the proportion equal to said second predetermined multiple of said associated series resistance circuit.

22. A method for determining the gain of an operational amplifier having an input and an output terminal with the gain thereof determined by the ratio of the resistance in a feedback leg connected between the input and the output terminal and an input leg connected in series between the input terminal and an input analog signal, comprising:
selecting a fixed resistor for the input leg of a first fixed value and a variable resistor connected in series with the fixed resistor, the variable resistor having a current variable resistance of a first variable value that varies as a function of the series current therethrough; and
selecting one of a plurality of feedback circuits for the feedback leg, each having:
a fixed series resistance with a fixed resistance value that is a predetermined multiple of the first fixed value associated with the input leg, and
a series connected variable resistance having a variable resistance value that is proportional to the first variable value of the input circuit, the proportion being equal to the associated predetermined multiple.

23. The method of claim 22 wherein the step of selecting the feedback circuit comprises:
disposing a plurality of feedback legs between the input and output of the operational amplifier, each of the input legs comprised of a fixed value resistance being a predetermined multiple of the first fixed value and a series connected switch connected between one end of the fixed resistor and the input of the amplifier, the switch having a series variable resistance that is proportional to the first variable value, the proportion being equal to the associated predetermined multiple; and
selecting one of the switches to conduct.

* * * * *